(12) United States Patent
Lau et al.

(10) Patent No.: US 12,745,345 B1
(45) Date of Patent: Sep. 22, 2026

(54) SINGLE AXIS CONDUCTIVE FLEXIBLE PRINTED CIRCUIT BOARD STIFFENER

(71) Applicant: Sesame AI, Inc., Los Angeles, CA (US)

(72) Inventors: Brian Scott Lau, Bellevue, WA (US); Matthew DeVoe, Bellevue, WA (US)

(73) Assignee: Sesame AI, Inc., Los Angeles, CA (US)

( * ) Notice: Subject to any disclaimer, the term of this patent is extended or adjusted under 35 U.S.C. 154(b) by 0 days.

(21) Appl. No.: 19/336,100

(22) Filed: Sep. 22, 2025

(51) Int. Cl.
*H05K 1/02* (2006.01)

(52) U.S. Cl.
CPC .................................. *H05K 1/0277* (2013.01)

(58) Field of Classification Search
CPC .................................................... H05K 1/0277
USPC .......................................................... 361/749
See application file for complete search history.

(56) References Cited

U.S. PATENT DOCUMENTS 7,874,880 B2 1/2011 Fedde et al.
9,048,565 B2 6/2015 Palaniappa et al.
9,374,892 B1 6/2016 Mobley et al.
9,691,634 B2 6/2017 Koelling
10,136,543 B1 11/2018 Nadkarni et al.
11,259,414 B2 2/2022 Powney et al.
11,646,246 B2 5/2023 Mobley et al.
11,775,119 B1 * 10/2023 Song ....................... G06F 3/044 361/749
2011/0255250 A1 * 10/2011 Dinh ..................... B32B 17/061 174/250
2014/0140018 A1 * 5/2014 Malek ................. H04M 1/0277 361/752
2016/0005715 A1 * 1/2016 Fazelpour ............. H10W 40/70 257/713
2022/0140514 A1 5/2022 Buck et al.
2022/0304149 A1 9/2022 Qiao et al.

FOREIGN PATENT DOCUMENTS

CA 3003470 6/2017

OTHER PUBLICATIONS

Z-Axis, "Elastomeric Connectors that Fit Your Application, Tolerances and Budget," Z-Axis Connector Company, https://www.zaxisconnector.com/products/connector-strips/, pp. 1-3.

(Continued)

*Primary Examiner* — Andargie M Aychillhum
(74) *Attorney, Agent, or Firm* — SoCal IP Law Group LLP; Jonathan Pearce

(57) ABSTRACT

There is disclosed a flexible printed circuit board stiffener which includes a body having a top and a bottom, the body comprised of a non-conductive material interspersed with a plurality of conductive elements that traverse the body from the top to the bottom along a vertical axis. The non-conductive material arranged such that electrical current does not move through the body other than in a direction parallel to the vertical axis along the conductive elements with the plurality of conductive elements arranged such that electrical components arranged above the stiffener in contact with the plurality of conductive elements are conductively in connected through the body from the top to the bottom along a plurality of paths parallel to the vertical axis.

25 Claims, 7 Drawing Sheets

(56) References Cited

OTHER PUBLICATIONS

Ironwood Electronics, "Socket Technologies Summary," https://www.ironwoodelectronics.com/wp-content/uploads/2025/05/socket_technologies.pdf, pp. 1-12.
Samtec Sudden Services, "Z-Ray Interposer Application Design Guide," https://elcon-electronic.de/fileadmin/user_upload/samtec-zray-interposer-design-guide.pdf. Feb. 2018, pp. 1-4.
Fujipoly, "Zebra Elastomeric Connectors," https://www.fujipoly.com/zebra-connectors, Fujipoly America, New Jersey, Aug. 1, 2025, pp. 1-5.

* cited by examiner

PRIOR ART

© 2025 Sesame AI, Inc.

SINGLE AXIS CONDUCTIVE FLEXIBLE PRINTED CIRCUIT BOARD STIFFENER

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to electronics manufacturing and, more particularly, to a single axis conductive flexible printed circuit board stiffener for use in electronic devices.

Description of the Related Art

Printed circuit boards (PCBs) which have existed in some form since the late 1970s. In the earliest iterations a "board" made of fiberglass. Fiberglass is used because it is cheap, lightweight, durable, and has excellent insulating properties (primarily for electrically isolating the components joined to the PCB). The general concept of PCBs is to effectively "print" a fiberglass board with a pattern of electrically-conductive material (usually copper, gold, silver or the like) that fits a desired circuit or series of circuits and electronic components. As used herein the phrase "electronic components" expressly does not mean electrically conductive wiring, foil or film. Instead, it means an integrated chip or component that is intended to be soldered to a PCB or flexible printed circuit board (FPCB) along a flat surface or plane. The electronic components may include controllers, central processing units (CPUs), graphics processing units (GPUs), system-on-chips (SoCs) memory modules, diodes, resisters, capacitors, switches, sensors, peripheral ports, charging ports, connectors for these components, and the like. These electronic components can then be soldered to the pattern printed on or in the PCB (in some cases, the pattern may be partially or wholly internal to the PCB). This overall type of structure for PCBs and electronic components enables significant levels of automation as a PCB can be fabricated many times over using specially-designed machines for adding conductive material in desired places, placing the various electronic components, and then soldering them in place on the PCB (front and back, depending on the desired component).

FPCBs are an iteration of PCBs that rely upon flexible, insulating material in place of the traditional fiberglass. Typical materials are polyimide or polyester films. Copper foil (or extremely thin wires) are typically placed upon or within the FPCB to act much as the copper, silver, or gold conductive material in much the same way. Because these materials are likewise generally flexible, particularly copper, the FPCB can generally flex and bend and go around corners or otherwise be shaped in any number of ways to enable manufacturers to create electronic devices of various shapes and sizes that may not be possible or practical with traditional PCBs.

FPCBs have proven to be extremely flexible in their applications. Devices like the Apple® iPhone® use FPCBs in various components such as the cameras to both act as a ribbon cable joining the cameras to the primary PCB and upon which to conductively mount the cameras' electronic enclosure. Wearable devices are another place where FPCBs have been widely used. So-called smart rings or other fitness-tracking devices have used FPCBs as their primary or secondary electronics controller board, oftentimes without any traditional PCB at all. Smart glasses, with embedded electronics therein, also often rely upon FPCBs.

However, because FPCBs are just that, flexible, and most individual electronic components (e.g. CPUs, systems on chips, GPUs, memory chips, camera enclosures, sensors, inertial measurement units (IMUs), SoCs, etc.) are solid, and designed to be joined to other soldered connections along a flat plane (e.g. a PCB), components called "stiffeners" are used as backing for the FPCBs in places where particular electronic components must be joined to the FPCB in order to make them "flat" locally to enable a solid solder. In the absence of these flexible printed circuit board stiffeners (hereinafter a "stiffener"), it is much more likely that one of the solders holding these electronic components to the FPCB would come loose, thereby rendering the associated electronic device in which the components are operating non-functional or damaged.

In practice, for example in the context of a ring-based wearable device, the FPCB is generally arranged in a circular or semi-circular pattern around the interior of the wearable device. An exterior and an interior band of some material (typically metal or a combination of metal and a polymer or hardened epoxy resin) surround the electronic components and the FPCB. In a typical case, the electronic components are arranged on the "outside" of the FPCB and the ring (e.g. facing outward, away from a finger of a wearer). This orientation is primarily chosen because it provides slightly more surface area upon which to mount the electronics, making them less-cramped and makes the connections between them slightly shorter. Mounting electronics on the interior of the ring would force some components to be spaced further apart since they sit in flat planes (e.g. with the stiffener underneath them on the other side of the FPCB) and the tops or edges of the electronic components could otherwise interface with one another.

As a result of the electronic components mounted on the exterior of the FPCB and the required stiffener affixed to the backside of the FPCB to mount the electronic components, the FPCB takes on a roughly polygonal shape in cross-section, rather than being perfectly circular or semi-circular. It may appear, for example, as an octagon in cross-section, with several flattened areas where electronic components are mounted, each joined to the next flattened area with a small section of FPCB having no stiffener that may take on a rounded or even angular cross-sectional appearance. This polygonal shape is hidden within the wearable device by the exterior and interior bands so that the ring itself appears perfectly (or near-perfectly) rounded on the inside and the outside.

The FPCB is designed in such a way that electrical components may be added on either side of an FPCB. They can, as with the iPhone® described above, operate effectively as ribbon cables connecting various components. However, because these stiffeners are typically solid sheets of PCB (typically fiberglass as well, but may be stainless steel, or a thicker version of the polyimide or polyester used for the FPCB itself) which are very good insulators—chosen for that characteristic—or entirely conductive in the case of stainless steel, it is typically impossible to mount an electronic component on the "back" side of the FPCB where a FPCB stiffener is placed. In some cases, the stiffener may be conductive metal, in which case it is entirely conductive, which would short any electric connectivity provided there or electronic component mounted there. If one wishes to conduct electricity there or mount an electronic component there, typically one would run another FPCB "around" the stiffener to connect the component on the backside (i.e. opposite side of the FPCB of the electronic component) of the stiffener. In the case of a wearable device such as a smart ring, extra space sufficient to run another FPCB is extremely limited or may be impossible, so this solution is not suitable for such an application. And, in wearable devices more generally (e.g. smart watches, smart glasses, fitness trackers, etc.), weight and space are always at a premium if one wishes to provide the best possible user experience (e.g. smaller, more aesthetically pleasing devices), so such an option is undesirable, even when it may be possible.

Figure 1:
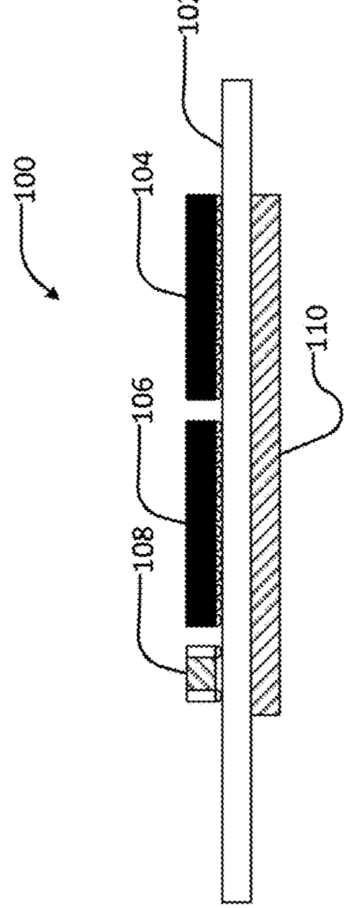
FIG. 1 is an example of a prior art flexible printed circuit board system including a stiffener.

Throughout this description, elements appearing in figures are assigned three-digit reference designators, where the most significant digit is the figure number and the two least significant digits are specific to the element. An element that is not described in conjunction with a figure may be presumed to have the same characteristics and function as a previously-described element having a reference designator with the same least significant digits.

NON-LIMITING ASPECTS OF THE DISCLOSURE

The following clauses form non-limiting aspects of the present disclosure.

1. A flexible printed circuit board comprising:
   - a first side and a second side opposite, the first side along a vertical axis;
   - the first side including at least one electronic component, joined to conductive material along the first side of the flexible printed circuit board;
   - the second side including a plurality of conductive elements, a subset of which are joined to the at least one electronic component through the flexible printed circuit board along the vertical axis to the conductive material along the first side; and
   - a flexible printed circuit board stiffener, affixed to the second side in conductive contact with the plurality of conductive elements, the stiffener including a plurality of transverse conductors parallel to the vertical axis suitable to conduct current from the at least one electronic component through the flexible printed circuit board and through the stiffener to at least one substrate conductive element on an opposite side of the stiffener from the flexible printed circuit board.
2. The flexible printed circuit board of clause 1 wherein the stiffener is affixed to the second side using an anisotropic conductive material that conducts current only parallel to the vertical axis.
3. The flexible printed circuit board of any of the preceding clauses wherein the stiffener is affixed to the at least one substrate conductive element on the opposite side of the stiffener from the flexible printed circuit board by an anisotropic conductive materials that conducts current only along the vertical axis respective of the first and second sides.
4. The flexible printed circuit board of any of the preceding clauses arranged in a circular or semi-circular shape with the top forming an exterior of the circular or semi-circular shape and the second side forming an interior of the circular or semi-circular shape.
5. The flexible printed circuit board of clause 4 encased within a wearable device in the form of a circular ring and wherein the first side is adjacent to an exterior of the circular ring and the second side is adjacent to the interior of the circular ring.
6. The flexible printed circuit board of any of the preceding clauses wherein the at least one substrate conductive element is two substrate conductive elements, each conductively joined to one pole of a battery charging system.
7. The flexible printed circuit board of clause 6 wherein the two substrate conductive elements are conductively joined to an exterior of a metal forming the circular ring, and the metal is divided by an insulating material into a first half and a second half, such that contact by a first charging probe from the battery charging system with the first half and simultaneous contact by a second charging probe from the battery charging system with the second half causes a battery within the circular ring to begin charging.
8. The flexible printed circuit board of clause 7 wherein the two substrate conductive elements are joined conductively within the wearable device with a battery charge controller and a battery.
9. A method of manufacturing a flexible printed circuit board including a single-axis conductive stiffener comprising:
   - affixing the single-axis conductive stiffener to a bottom side of the flexible printed circuit board;
   - affixing at least one electrical component to a top side of the flexible printed circuit;
   - affixing any pass-through electronic components to a bottom side of the single-axis conductive stiffener; and
   - fixing the flexible printed circuit board including the single-axis conductive stiffener within an electronic device.
10. The method of clause 9 wherein the at least one electrical component is joined to a conductive material.
11. The method of any of clauses 9-10 wherein the bottom side of the flexible printed circuit board comprises a plurality of conductive elements, a subset of which are joined to the at least one electronic component through the flexible printed circuit board along a vertical axis to the conductive material along the top side of the flexible printed circuit board.

12. The method of any of clauses 9-11 wherein the single-axis conductive stiffener includes a plurality of transverse conductors parallel to a vertical axis of the bottom side of the flexible printed circuit board suitable to conduct current from the at least one electronic component through the flexible printed circuit board and through the stiffener to at least one substrate conductive element on an opposite side of the stiffener from the flexible printed circuit board.

13. The method of any of clauses 11-12 wherein the stiffener is affixed to the bottom side using an anisotropic conductive material that conducts current only parallel to a vertical axis of the bottom side of the flexible printed circuit board.

14. The method of any of clauses 11-12 wherein the stiffener is affixed to the at least one substrate conductive element on the opposite side of the stiffener from the flexible printed circuit board by an anisotropic conductive materials that conducts current only along a vertical axis of the bottom side of the flexible printed circuit board.

15. The method of any of clauses 9-14 further comprising:
 arranging the flexible printed circuit board in a circular or semi-circular shape;
 encasing the flexible printed circuit board within a wearable device in the form of a circular ring.

16. The method of clause 15 wherein the flexible printed circuit board arranged with the top side forms an exterior of the circular or semi-circular shape and the bottom side forms an interior of the circular or semi-circular shape.

17. The method of any of clauses 15-16 wherein the top side of the flexible printed circuit board is adjacent to an exterior of the circular ring and the bottom side is adjacent to the interior of the circular ring.

18. The method of any of clauses 12-14 wherein at least one substrate conductive element is two substrate conductive elements, each conductively joined to one pole of a battery charging system.

19. The method of clause 18 wherein the two substrate conductive elements are conductively joined to an exterior of a metal forming the circular ring, and the metal is divided by an insulating material into a first half and a second half, such that contact by a first charging probe from the battery charging system with the first half and simultaneous contact by a second charging probe from the battery charging system with the second half causes a battery within the circular ring to begin charging.

20. A method of manufacturing a single-axis conductive stiffener comprising:
 placing a plurality of conductive elements within a stiffener mold;
 injecting the stiffener mold with a non-conductive material forming a sheet; and
 deriving a plurality of single-axis conductive stiffeners from the sheet.

21. The method of clause 20 wherein the plurality of stiffeners is cut or stamped out of the sheet.

22. The method of any of clauses 20-21 wherein the non-conductive material is fiberglass or polyimide.

23. The method of any preceding clauses further comprising:
 affixing the single-axis conductive stiffener to a bottom side of a flexible printed circuit board;
 affixing at least one electrical component to a top side of the flexible printed circuit board;
 affixing any pass-through electronic components to a bottom side of the single-axis conductive stiffener; and
 affixing the flexible printed circuit board including the single-axis conductive stiffener within an electronic device.

24. The method of clause 23 wherein the at least one electrical component is joined to a conductive material.

25. The method of any of clauses 23-24 wherein the bottom side of the flexible printed circuit board comprises a plurality of conductive elements, a subset of which are joined to the at least one electronic component through the flexible printed circuit board along a vertical axis to the conductive material along the top side of the flexible printed circuit board.

26. The method of any of clauses 23-25 wherein the single-axis conductive stiffener including a plurality of transverse conductors parallel to a vertical axis of the bottom side of the flexible printed circuit board suitable to conduct current from the at least one electronic component through the flexible printed circuit board and through the stiffener to at least one substrate conductive element on an opposite side of the stiffener from the flexible printed circuit board.

27. The method of any of clauses 23-26 wherein the stiffener is affixed to the bottom side using an anisotropic conductive material that conducts current only parallel to a vertical axis of the bottom side of the flexible printed circuit board.

28. The method of any of clauses 23-27 wherein the stiffener is affixed to the at least one substrate conductive element on the opposite side of the stiffener from the flexible printed circuit board by an anisotropic conductive materials that conducts current only along a vertical axis of the bottom side of the flexible printed circuit board.

29. The method of any of clauses 23-28 further comprising the steps of:
 arranging the flexible printed circuit board in a circular or semi-circular shape;
 encasing the flexible printed circuit board within a wearable device in the form of a circular ring.

30. The method of clause 29 wherein the flexible printed circuit board arranged with the top side forms an exterior of the circular or semi-circular shape and the bottom side forms an interior of the circular or semi-circular shape.

31. The method of any of clauses 29-30 wherein the top side of the flexible printed circuit board is adjacent to an exterior of the circular ring and the bottom side is adjacent to the interior of the circular ring.

32. The method of any of clauses 29-31 wherein at least one substrate conductive element is two substrate conductive elements, each conductively joined to one pole of a battery charging system.

33. The method of any of clauses 29-32 wherein the two substrate conductive elements are conductively joined to an exterior of a metal forming the circular ring, and the metal is divided by an insulating material into a first half and a second half, such that contact by a first charging probe from the battery charging system with the first half and simultaneous contact by a second charging probe from the battery charging system with the second half causes a battery within the circular ring to begin charging.

34. A method of manufacturing a single-axis conductive stiffener comprising:
injecting a stiffener mold with a non-conductive material forming a sheet;
cooling the sheet to room temperature;
forming a plurality of holes in the sheet;
placing a plurality of conductive elements each one of the plurality of holes; and
forming a plurality of single-axis conductive stiffeners from the sheet.

35. The method of clause 34 wherein the plurality of holes are formed by drilling or milling.

36. The method of any of clauses 34-35 wherein the plurality of stiffeners are be cut or stamped out of the sheet.

37. The method of any of clauses 34-36 wherein the non-conductive material is fiberglass.

38. A method of manufacturing a flexible printed circuit board including a single-axis conductive stiffener comprising:
affixing the single-axis conductive stiffener to a bottom side of the flexible printed circuit;
affixing at least one electrical component to a top side of the flexible printed circuit;
affixing any pass-through electronic components to a bottom side of the single-axis conductive stiffener; and
fixing the flexible printed circuit board including the single-axis conductive stiffener within an electronic device.

39. The method of clause 38 wherein the at least one electrical component is joined to a conductive material.

40. The method of any of clauses 38-39 wherein the bottom side of the flexible printed circuit board comprises a plurality of conductive elements, a subset of which are joined to the at least one electronic component through the flexible printed circuit board along a vertical axis to the conductive material along the top side of the flexible printed circuit board.

41. The method of any of clauses 38-40 wherein the single-axis conductive stiffener including a plurality of transverse conductors parallel to a vertical axis of the bottom side of the flexible printed circuit board suitable to conduct current from the at least one electronic component through the flexible printed circuit board and through the stiffener to at least one substrate conductive element on an opposite side of the stiffener from the flexible printed circuit board.

42. The method of any of clauses 38-41 wherein the stiffener is affixed to the bottom side using an anisotropic conductive material that conducts current only parallel to a vertical axis of the bottom side of the flexible printed circuit board.

43. The method of any of clauses 38-42 wherein the stiffener is affixed to the at least one substrate conductive element on the opposite side of the stiffener from the flexible printed circuit board by an anisotropic conductive materials that conducts current only along a vertical axis of the bottom side of the flexible printed circuit board.

44. The method of any of clauses 38-43 further comprising the steps of:
arranging the flexible printed circuit board in a circular or semi-circular shape;
encasing the flexible printed circuit board within a wearable device in the form of a circular ring.

45. The method of any of clauses 38-44 wherein the flexible printed circuit board arranged with the top side forms an exterior of the circular or semi-circular shape and the bottom side forms an interior of the circular or semi-circular shape.

46. The method any of clauses 38-45 wherein the top side of the flexible printed circuit board is adjacent to an exterior of the circular ring and the bottom side is adjacent to the interior of the circular ring.

47. The method of any of clauses 38-46 wherein at least one substrate conductive element is two substrate conductive elements, each conductively joined to one pole of a battery charging system.

48. The method of clause 47 wherein the two substrate conductive elements are conductively joined to an exterior of a metal forming the circular ring, and the metal is divided by an insulating material into a first half and a second half, such that contact by a first charging probe from the battery charging system with the first half and simultaneous contact by a second charging probe from the battery charging system with the second half causes a battery within the circular ring to begin charging.

DETAILED DESCRIPTION

The stiffener disclosed herein preserves space, but still provides the opportunity to connect electrically conductive material on an opposite side from an electronic component mounted on an FPCB with a backing stiffener. In short, mounting another electronic component to the underside of the stiffener or to selectively conduct electricity through the stiffener to some further cabling or electronic component has previously been impossible.

As disclosed herein, the stiffener itself may be interspersed with electrically conductive conduits or other materials that enable the stiffener to selectively pass an electrical connection through the FPCB to the bottom of the FPCB, through the stiffener itself, when carefully mounted or designed to be easily mounted only contacting certain conductors on the bottom of the FPCB, and may pass that current through to connectors or further electronic components on the bottom of the stiffener itself. This design is elegant in that it introduces no additional space-wasting FPCB to go "around" the stiffener, and enables the stiffener to serve a dual function as both a stiffener and an electrical pathway to selectively engage with electronic components on an opposite side of the stiffener away from the FPCB. Even the FPCB can be dual-sided, which is an extremely efficient use of space, a single stiffener can provide a planar contact point for two or more electronic components on opposite sides of the FPCB, and more electronic components or electrically conductive connections can be run on both sides of the FPCB to make more complex, but smaller wearable and other electronic devices.

Description of Apparatus

Referring now to FIG. 1, an example of a prior art flexible printed circuit board 102 system 100 including a stiffener 110 is shown. The flexible printed circuit board 102 has the stiffener 110 mounted on a bottom side. Several different electronic components 104, 106, 108 are affixed to a top of the flexible printed circuit board 102. As discussed above, the stiffener 110 is used to enable mounting of the planar electronic components 104, 106, 108 to the flexible printed circuit board. These components may be, for example, a system on a chip, an inertial measurement unit, and a resistor, respectively, but their exact type and purpose are not particularly relevant for this disclosure. The stiffener ensures that at the location where the electronic components 104, 106, 108 to the flexible printed circuit board, the flexible printed circuit board is, likewise, planar and remains so. Otherwise, should the flexible printed circuit board bend and flex, the solders (not labelled, but visible) joining the electronic components 104, 106, 108 to the flexible printed circuit board may break or otherwise wear and render the associated electronics unusable or non-functional.

Accordingly, in the prior art, stiffeners, like stiffener 110, are used to force the flexible printed circuit board to be planar and provide a secure mounting location for the electronic components 104, 106, 108 or other soldered components. The problem with these stiffeners of the prior art is that they are either entirely insulating (e.g. fiberglass or polyimide) or entirely conductive (e.g. aluminum or stainless steel). In either case, electrical current cannot be passed to the opposite side from the electronic components 104, 106, 108 of flexible printed circuit board (e.g. the bottom in FIG. 1) because it would either short out, or be insulated away. A cable or other routing of electrically conductive material must be used to power and control electronic components mounted on the underside of the flexible printed circuit board in the prior art systems. And, as indicated above, there is often insufficient space to do so, or it is cumbersome and wasteful to do so.

Figure 2B:
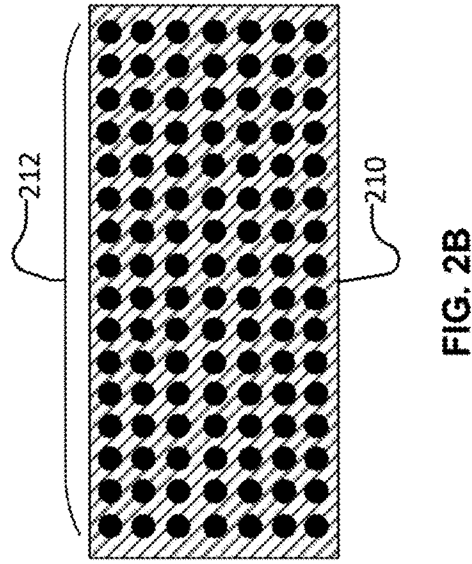
FIG. 2B is a top-down view of a single-axis conductive stiffener.
Figure 2A:
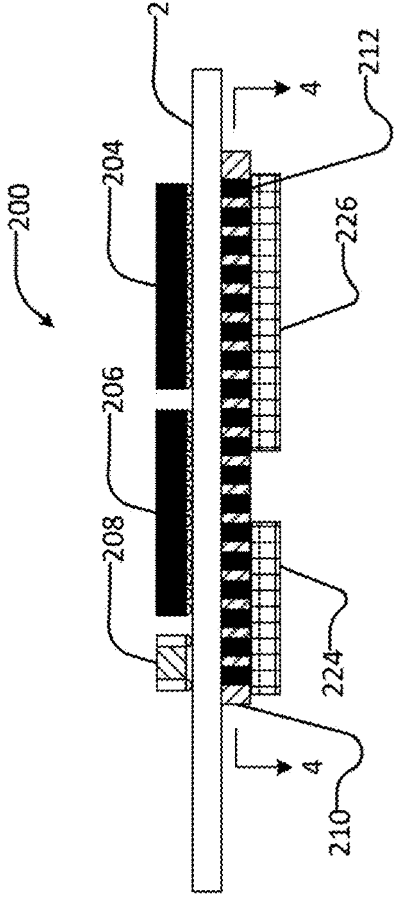
FIG. 2A is a flexible printed circuit board system including a single-axis conductive stiffener.

FIG. 2A is a flexible printed circuit board 202 system 200 including a single-axis conductive stiffener 210. Here, many of the same components are present. The flexible printed circuit board 202 has several electronic components 204, 206, 208 mounted on a top side. These may be the same electronic components 104, 106, 108 of FIG. 1. The stiffener 210 is still present, but this time it incorporates a plurality of conductive elements, like conductive element 212, which are each separated by the non-conductive material making up the stiffener 210 (e.g. fiberglass) so that each is electrically isolated from one another. In this way, the stiffener 210 is single-axis because it only passes current in one direction, along a vertical axis (as shown). Affixed to the bottom of the stiffener 210 are two electrically conductive elements 224, 226. These may be an exterior housing (see FIG. 5). Alternatively, other electronic components may be connected on this bottom (or back) of the stiffener 210.

FIG. 2B is a top-down view of a single-axis conductive stiffener 210. Here the conducive elements 212 may be seen more clearly. The exact shape, form, placement, and layout of the conductive elements 212 may vary from application to application. Here, a plurality are shown in a uniform, even pattern. This may be suitable for enabling specific electrically conductive elements to pass through the flexible printed circuit board 202 (FIG. 2A) and reach one or more of these conductive elements 212, thereby passing current through them to one of the electrically conductive elements 224, 226 (FIG. 2A) below. The conductive elements 212 may be arranged irregularly, in a pattern, or in a regular, uniform pattern as shown in FIG. 2B. And, the conductive elements 212 may be circular, square, rectangular or virtually any desired shape or size for a given application.

In other cases, a specific pattern or only a few conductive elements 212 may be present, each intended to interface with a particular contact on the back side (underside as shown) of the stiffener 210 to connect specific electronic components on that underside, or to connect to particular electrically conductive terminals interfacing with that back (or bottom as shown) of the stiffener 210. As shown in FIG. 2A, the intended purpose may be, for example, to enable electrical conductivity to pass along a vertical axis (as shown in FIG. 2A through the flexible printed circuit board 202 and stiffener 210 to each these electrically conductive elements 224, 226 which may act as contact points for external electric terminals or probes to engage with two points or surfaces to reach a battery controller to enable charging of a wearable device through conductivity enabled by the housing of the wearable device in the form of a ring (see FIG. 5 and associated discussion below). In such a case, the electrically conductive elements 224, 226 may be relatively large and may come into contact with many of the electrically conductive elements 212. Though, in the case of specific arrangements of the conductive elements 212 or careful positioning as is common for placement of electronic components on flexible printed circuit boards during manufacture, a custom-designed stiffener could be used to pass any number of specific, individual electrical connections into and through the flexible printed circuit board 202 stiffener 210. Electronic components may be mounted to the bottom (back) of such a flexible printed circuit board 202 and communicate through the stiffener 210 and flexible printed circuit board 202.

Figure 3:
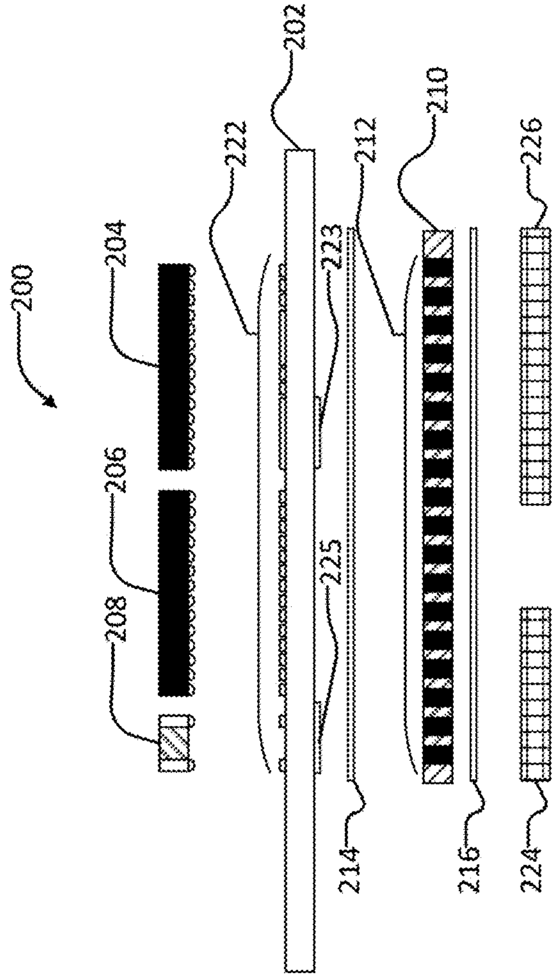
FIG. 3 is an exploded side view of a flexible printed circuit board system including a single-axis conductive stiffener.

FIG. 3 is an exploded side view of a flexible printed circuit board system 200 including a single-axis conductive stiffener 210. The same elements of FIGS. 2A and 2B are shown here and will not be discussed again. However, visible in FIG. 3 are electrical contacts 222 for the electronic components 204, 206, 208. In some cases only a single contact is present for a particular corresponding contact in the electronic component 204, 206, 208. But, in other cases, a number of contacts or a single, large contact is present, for example in the case of power connectors which may rely upon multiple contacts to the same surface. These types of contacts are particularly suitable for connections like charging via external power, as discussed above with reference to FIGS. 2A and 2B and below with reference to FIG. 5. There, a plurality of the conductive elements 212 may interface with the larger contact and with a larger conductive element (e.g. conductive elements 224, 226) to pass a larger current thereover. Conductors 223, 225 on the bottom of the flexible printed circuit board 202 may selectively pass current from certain of the electrical contacts 222 on the top of the flexible printed circuit board 202.

Also visible in this figure are anisotropic conductive adhesive 214, 216. These adhesives or films may be used to connect the electrical contacts 223, 225 on the bottom of the flexible printed circuit board 202 to the stiffener 210 and to connect the stiffener 210 to the larger conductive elements 224, 226. The anisotropic conductive adhesive 214, 216 is known in the space, but is not known to be used for this purpose. Specifically, anisotropic conductive adhesive is an adhesive that only passes current along a single axis-typically through the thinnest axis-when placed in contact with electrically-conductive components. This is accomplished by placing very tiny conductive material at some sufficient separation from one another within the adhesive. Thus, when the adhesive is applied to a surface, it flattens (e.g. between the two components being adhered to one another) and the conductive material thereby comes in contact with the component on the top (in the case of the anisotropic conductive adhesive 214) and bottom (in this case the bottom of the flexible printed circuit board 202 and the top of the stiffener 210).

So, a typical adhesive of this type may intersperse a plurality of tiny, silver balls within the adhesive. As the adhesive pulls the two adhered components together, the film remains non-conductive, while the silver balls collectively can conduct a charge through the adhesive, but only from the top (as shown in FIG. 3) to the bottom. In this way, electrical current passed through the flexible printed circuit board 202 may pass to and through the stiffener 210 using the conductive elements 212, and then pass again through the anisotropic adhesive film 216 to the larger conductive elements 224, 226. So, the use of the anisotropic adhesive film 214, 216 enables the electrical conductivity to move through the flexible printed circuit board 202 and to electronic components or conductors present on the opposite side along the vertical axis (as shown in FIG. 3).

Figure 4:
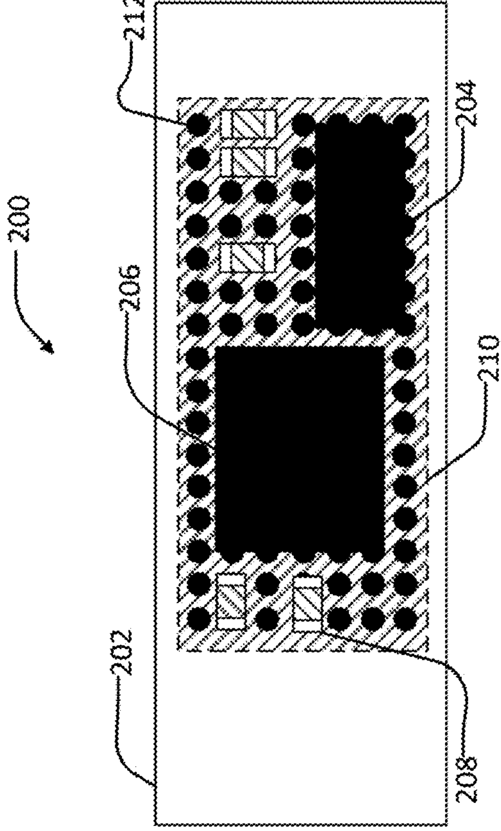
FIG. 4 is a top-down view of a flexible printed circuit board system including a single-axis conductive stiffener.

FIG. 4 is a top-down view of a flexible printed circuit board system 200 including a single-axis conductive stiffener 212. Here, the same elements previously discussed with reference to FIGS. 2A, 2B, and 3 are shown. A partially-transparent view of the flexible printed circuit board 202 is shown so that the stiffener 210 may be seen underneath along with the conductive elements 212. Here, the electronic components 204, 206, 208 are shown as arranged on the flexible printed circuit board 202 and the respective conductive elements 212 are visible as only interacting with potentially some of the electronic components 204, 206, 208 or some of the terminals exiting the electronic components 204, 206, 208.

Figure 5:
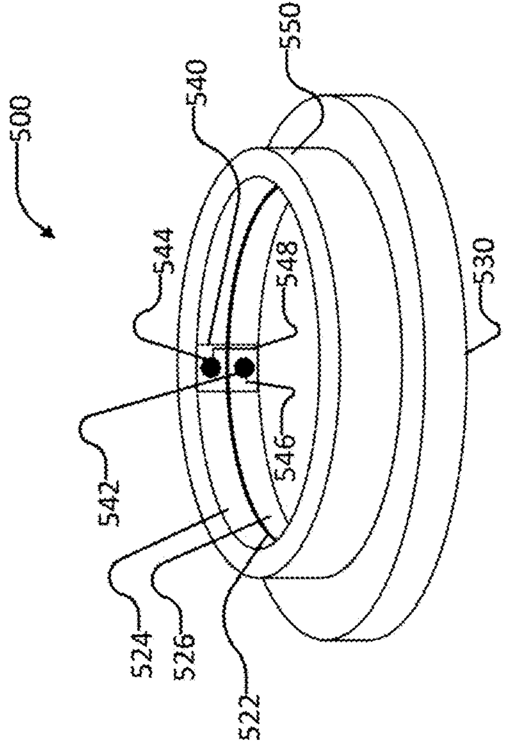
FIG. 5 is an example of a charging system for a wearable device using a charging dock reliant upon the single-axis conductive stiffener.

FIG. 5 is an example of a charging system 500 for a wearable device 550 using a charging dock 530 reliant upon the single-axis conductive stiffener. In this figure, the flexible printed circuit board (not shown) is wrapped around the interior of the ring that is the wearable device 550. Notably, the two conductive elements 524, 526 (224, 226 in FIGS. 2A and 3) are shown. They form un upper and lower portion (as shown in FIG. 5) of the interior band of the ring that is the wearable device 550. Combining the disclosures of FIGS. 2A and 3 with FIG. 5 shows that the conductive elements 524, 526 may be used to pass current through the stiffener (not shown in FIG. 5) and to a charge controller on the top (as shown in FIG. 2A) of the flexible printed circuit board. But, notably, because the conductive elements 524, 526 are on the "bottom" of the flexible printed circuit board, and make up a part of the interior band of the ring, the band itself is conductive to the charge controller. Its surface may be used as a conductive surface for charging the wearable device 550.

The conductive elements 524, 526 are electrically isolated from one another by an insulator material 522. Thus, one of the conductive elements 524 may be a positive connection suitable for charging while the other conductive element 526 may be a negative connection. A set of charging probes (or terminals) 542, 544 may offer corresponding positive and negative connections to a charging source, connected to the base by suitable conductive wiring 546, 548.

The probes 542, 544 may be mounted on a charger block 540 that is formed as a part of the charging dock 530. As shown, the charger block 540 is transparent so its internal components may be seen, but it need not be. The charger block 540 rises from the charging dock 530 to offer flexible probes 542, 544 that touch the metal interior of the ring or other wearable device to enable charging when current is applied through the conductive elements 524, 526. Rather than being transparent and being merely a solitary element, the charger block 540 is more likely to be integrated into a charging dock 530 including a locating peg or similar element that will hold the wearable 550 in place in contact with the probes 542, 544 (which may be spring-mounted to force them outward toward the conductive elements 524, 526) so that charging of the wearable device 550 may take place. The locating peg's exterior may approximately match the interior dimensions of the ring or other wearable device 550 and may act as a pseudo finger upon which the ring may be placed to begin charging with the probes extending outward and to the side of the pseudo finger.

Notably, with reference to FIG. 5, the ability of the single-axis conductive stiffener to pass current through the flexible printed circuit board from a top (exterior of the ring) to the bottom (interior of the ring) enables the metal making up the bottom (interior of the ring) to itself function as a charge connector to a suitably-designed charging dock 530 including a charger block 540. In other cases, the flexible printed circuit board may be flipped, internally in the wearable device 550 or in other wearable devices (e.g. smart glasses, smart watches, etc.) in which case the exterior of the ring, or an exterior portion of another wearable device may be used as conductive elements 524, 526 suitable for charging in a corresponding type of dock. Such a system may still rely upon the single-axis conductive stiffener as described herein.

Description of Processes

Figure 6:
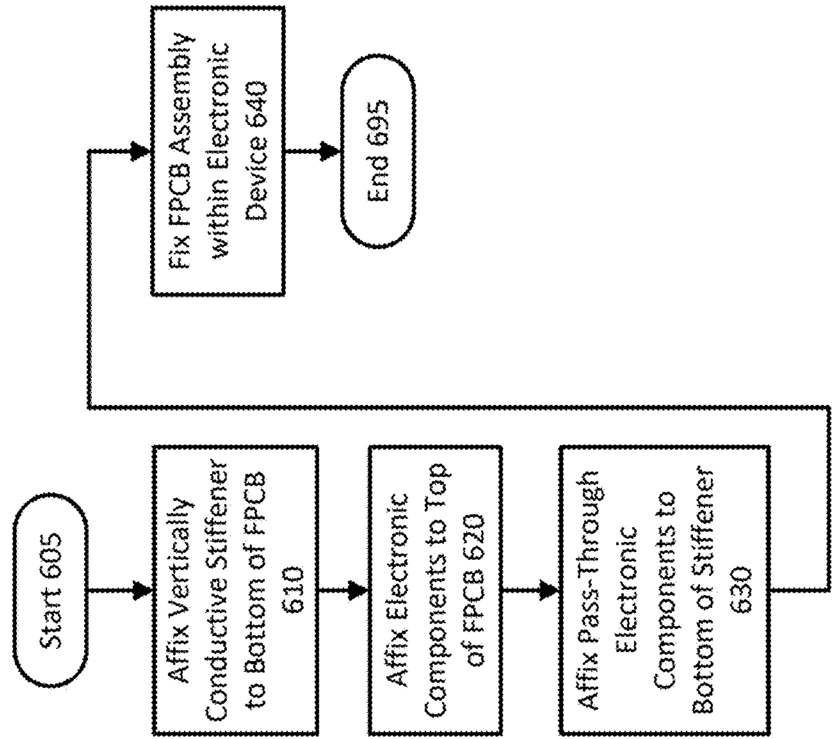
FIG. 6 is a flowchart of a process for manufacturing a flexible printed circuit board including a single-axis conductive stiffener.

Referring now to FIG. 6, a flowchart of a process for manufacturing a flexible printed circuit board including a single-axis conductive stiffener is shown. The process begins at 605 and ends at 695, but may take place many times over for each flexible printed circuit board manufactured that includes the single-axis conductive stiffener.

Following the start at 605, the process begins with affixing the single-axis conductive stiffener to the bottom of a flexible printed circuit board at 610. The anisotropic adhesive film or adhesive may be used to affix the stiffener to the flexible printed circuit board. This film may be applied only in particular locations or may cover the entirety of the stiffener. Preferably, only conductive terminals that are intended to interface with the electrical contacts on the back of the flexible printed circuit board will actually contact the electrical contacts to pass current therethrough.

Next, at 620, the electrical components are affixed to the top of the flexible printed circuit board. Here, the processors, resistors, SoCs, and the like are soldered to terminals on the top of the flexible printed circuit board in locations where the single-axis conductive stiffener has been affixed in step 610.

Next, any pass-through electronic components are affixed to the bottom of the single-axis conductive stiffener. Again, anisotropic adhesive or film may be used to ensure that the two components are electrically connected in addition to adhered to one another. In this way, current may selectively be passed through the flexible printed circuit board all the way through the single-axis conductive stiffener to electrical connections, a housing (e.g. in the wearable device discussed with reference to FIG. 5) or other electrical elements below the flexible printed circuit board.

Finally, the flexible printed circuit board including the single-axis conductive stiffener is fixed within the electronic device 640. Here, for example, the flexible printed circuit board is affixed within the ring, wearable device, smart glasses, smart watch or similar, small form factor or otherwise electronic device. No additional cabling is required to pass current through the single-axis conductive stiffener, thus cutting down on manufacturing costs, and potential failure points.

The process then ends at 695.

Figure 7:
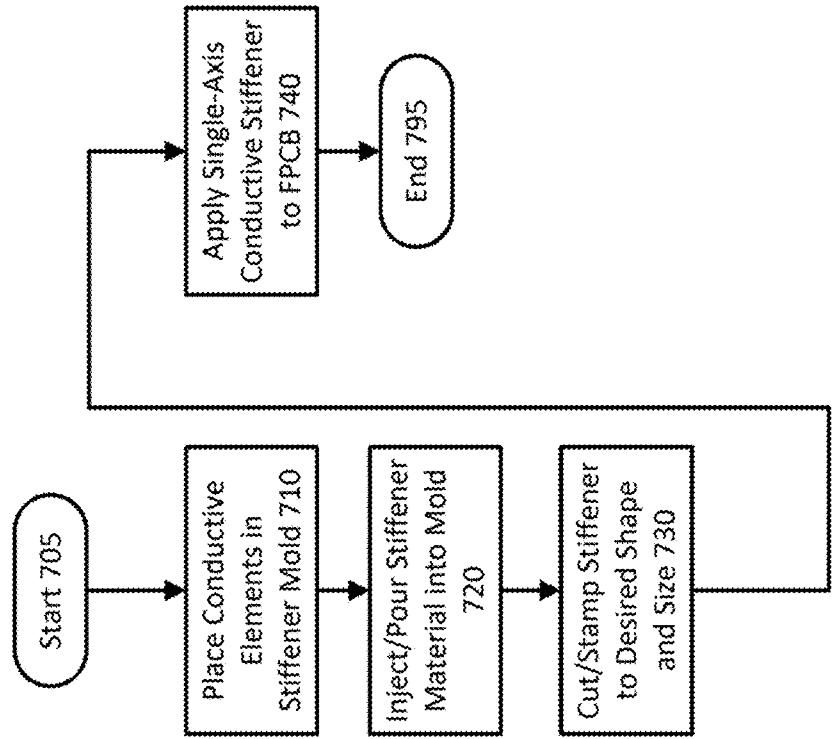
FIG. 7 is a flowchart of a process for manufacturing a single-axis conductive stiffener.

FIG. 7 is a flowchart of a process for manufacturing a single-axis conductive stiffener. The process begins at 705 and ends at 795, but may take place many times over for each single-axis conductive stiffener manufactured.

After the start at 705, the process begins with placement of conductive elements within a stiffener mold at 710. In a typical manufacturing case, single-axis conductive stiffeners may be manufactured in a large form factor, later to be "cut" or "stamped" to a desired size. In other cases, a plurality of molds of precisely the desired size may be made to create a plurality of single-axis flexible printed circuit board stiffeners of a desired size from the outset. In either case, it is simplest to place the conductive elements first within the mold, and to hold them in place within the mold at desired distances apart from one another.

Next, the material to be used is injection molded or poured into the associated mold to create the single-axis conductive stiffener. It may then cool or otherwise chemically harden with the conductive elements therein. In the case of fiberglass, depending on the size of the associated fibers, the process may be more like a smearing mold-filling process using automated machinery, and the resulting single-axis conductive stiffener may need to be sanded or otherwise shaved down to a desired thickness and to expose the conductive elements thereafter.

Alternatively, in some cases, an ordinary stiffener (e.g. of fiberglass) may be manufactured. Thereafter, a plurality of holes may be drilled or milled into the stiffener, and electrically-conductive material may be placed into each of the plurality of holes. This is somewhat the inverse of the process described with reference to step 710 and 720. But, either option is possible.

Next, because the single-axis conductive stiffener is typically manufactured in large sheets, and the applications for such stiffeners, particularly in the examples shown herein, can be incredibly small—on the order of microns to just a few millimeters in diameter—the single-axis conductive stiffeners are cut or stamped to desired shapes and sizes at 730. Here, very tiny single-axis conductive stiffeners may be created through an automated process designed to waste as little excess material as possible in the stamping or cutting.

Finally, the single-axis conductive stiffener is applied to a flexible printed circuit board, at 740 as described with reference to FIG. 6.

The process then ends at 795.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A flexible printed circuit board comprising:

a top and a bottom, opposite one another along a vertical axis;

the top including at least one electronic component, joined to conductive material along the top of the flexible printed circuit board;

the bottom including a plurality of conductive elements, a subset of which are electrically connected to the at least one electronic component through the flexible printed circuit board along the vertical axis to the conductive material along the top; and a flexible printed circuit board stiffener, affixed to the bottom in conductive contact with the plurality of conductive elements, the stiffener including a plurality of transverse conductors parallel to the vertical axis suitable to conduct current from the at least one electronic component through the flexible printed circuit board and through the stiffener using the plurality of transverse electrical conductors to at least one substrate conductive element on an opposite side of the stiffener from the flexible printed circuit board.

2. The flexible printed circuit board of claim 1 wherein the stiffener is affixed to the bottom using an anisotropic conductive material that conducts current only parallel to the vertical axis.

3. The flexible printed circuit board of claim 2 wherein the stiffener is affixed to the at least one substrate conductive element on the opposite side of the stiffener from the flexible printed circuit board by an anisotropic conductive material that conducts current only along the vertical axis.

4. The flexible printed circuit board of claim 1 arranged in a circular or semi-circular shape.

5. The flexible printed circuit board of claim 4 encased within a wearable device in the form of a circular ring and wherein the top is adjacent to an exterior of the circular ring and the bottom is adjacent to the interior of the circular ring.

6. The flexible printed circuit board of claim 1 wherein the at least one substrate conductive element is two, separate substrate conductive elements, each conductively joined to one pole of a battery by a subset of the plurality of transverse conductors passing through the stiffener.

7. The flexible printed circuit board of claim 6 wherein the two substrate conductive elements are conductively joined to an exterior of a metal forming the circular ring, and the metal is divided by an insulating material into a first half and a second half, such that contact by a first charging probe from the battery charging system with the first half and simultaneous contact by a second charging probe from the battery charging system with the second half causes a battery within the circular ring to begin charging.

8. The flexible printed circuit board of claim 7 wherein the two substrate conductive elements are joined conductively within the wearable device with a battery charge controller and battery.

9. A flexible printed circuit board comprising:

a top and a bottom, opposite one another along a vertical axis;

the top including a plurality of electronic components, joined to conductive material along the top of the flexible printed circuit board;

the bottom including a plurality of conductive elements, a subset of which are electrically connected to the plurality of electronic components through the flexible printed circuit board along the vertical axis to the conductive material along the top; and a flexible printed circuit board stiffener, substantially flat such that the electronic components can be conductively joined to the conductive material along the top, the stiffener affixed to the bottom in conductive contact with the plurality of conductive elements and including a plurality of transverse conductors parallel to the vertical axis suitable to conduct current from the plurality of electronic components through the flexible printed circuit board and through the stiffener using the plurality of transverse electrical conductors to at least one substrate conductive element on an opposite side of the stiffener from the flexible printed circuit board.

10. The flexible printed circuit board of claim 9 wherein the stiffener is affixed to the bottom using an anisotropic conductive material that conducts current only parallel to the vertical axis.

11. The flexible printed circuit board of claim 10 wherein the flexible printed circuit board stiffener is affixed to the at last one substrate conductive element on the opposite side of the stiffener from the flexible printed circuit board by an anisotropic conductive materials that conducts current only along the vertical axis.

12. The flexible printed circuit board of claim 9 arranged in a circular or semi-circular shape.

13. The flexible printed circuit board of claim 12 encased within wearable device in the form of a circular ring and wherein the top is adjacent to an exterior of the circular ring and the bottom is adjacent to the interior of the circular ring.

14. The flexible printed circuit board of claim 13 wherein the at least one substrate conductive element is two, separate substrate conductive elements, each conductively joined to one pole of a battery charging system by a subset of the plurality of transverse conductors passing through the stiffener.

15. The flexible printed circuit board of claim 14 wherein the two substrate conductive elements are conductively connected to an exterior of a metal forming the circular ring, and the metal is divided by an insulating material into a first half and a second half, such that contact by a first charging probe from the battery charging system with the first half and simultaneous contact by a second charging probe from the battery charging system with the second half causes a battery within the circular ring to begin charging.

16. A flexible printed circuit board stiffener comprising:

a body having a top and a bottom, the body comprised of a non-conductive material interspersed with a plurality of conductive elements that traverse the body from the top to the bottom along a vertical axis;

the non-conductive material arranged such that electrical current does not move through the body other than in a direction parallel to the vertical axis along the plurality of conductive elements; and the plurality of conductive elements arranged such that electrical components arranged above the stiffener in contact with the plurality of conductive elements are conductively in connection through the body from the top to the bottom along a plurality of paths parallel to the vertical axis.

17. The flexible printed circuit board stiffener of claim 16 further comprising a flexible printed circuit board below which the flexible printed circuit board stiffener is conductively affixed with the top of the body joined to the flexible printed circuit board along its base.

18. The flexible printed circuit board stiffener of claim 17 further comprising at least one electrical component affixed to a face of the flexible printed circuit board, with conductive material joining the face to the base to thereby contact the top of the flexible printed circuit board stiffener.

19. The flexible printed circuit board stiffener of claim 18 further comprising at least two electrically conductive probes electrically connected to at least two of the plurality of conductive elements passing through the body and joined at the bottom.

20. The flexible printed circuit board stiffener of claim 16 incorporated into a circular or semi-circular flexible printed circuit board within a wearable device in the form of a ring.

21. The flexible printed circuit board of claim 4 wherein the top forms an exterior of the circular or semi-circular shape and the bottom forms an interior of the circular or semi-circular shape.

22. The flexible printed circuit board of claim 9 wherein the top forms an exterior of the circular or semi-circular shape and the bottom forms an interior of the circular or semi-circular shape.

23. The flexible printed circuit board of claim 9 wherein the at least one substrate conductive element is two, separate substrate conductive elements, each conductively joined to one pole of a battery by a subset of the plurality of transverse conductors passing through the stiffener.

24. The flexible printed circuit board of claim 16 wherein the top forms an exterior of the circular or semi-circular shape and the bottom forms an interior of the circular or semi-circular shape.

25. The flexible printed circuit board of claim 16 wherein the at least one substrate conductive element is two, separate substrate conductive elements, each conductively joined to one pole of a battery by a subset of the plurality of transverse conductors passing through the stiffener.

* * * * *